(12) United States Patent
Momota et al.

(10) Patent No.: US 9,437,678 B2
(45) Date of Patent: Sep. 6, 2016

(54) FABRICATION METHOD OF SEMICONDUCTOR DEVICE, EVALUATION METHOD OF SEMICONDUCTOR DEVICE, AND SEMICONDUCTOR DEVICE

(71) Applicants: FUJI ELECTRIC CO., LTD., Kawasaki-shi, Kanagawa (JP); DENSO CORPORATION, Kariya-shi, Aichi (JP)

(72) Inventors: Seiji Momota, Nagano (JP); Hitoshi Abe, Nagano (JP); Kenji Kouno, Gifu (JP); Hiromitsu Tanabe, Nagoya (JP)

(73) Assignees: FUJI ELECTRIC CO., LTD., Kawasaki-shi (JP); DENSO CORPORATION, Kariya-shi (JP)

( * ) Notice: Subject to any disclaimer, the term of this patent is extended or adjusted under 35 U.S.C. 154(b) by 0 days.

(21) Appl. No.: 14/674,478

(22) Filed: Mar. 31, 2015

(65) Prior Publication Data
US 2015/0311285 A1 Oct. 29, 2015

(30) Foreign Application Priority Data
Apr. 23, 2014 (JP) ................. 2014-089124

(51) Int. Cl.
| | |
|---|---|
| H01L 29/66 | (2006.01) |
| H01L 29/06 | (2006.01) |
| H01L 21/66 | (2006.01) |
| H01L 29/739 | (2006.01) |
| H01L 29/423 | (2006.01) |
| H01L 23/00 | (2006.01) |
| G01R 31/26 | (2014.01) |

(52) U.S. Cl.
CPC ....... *H01L 29/0696* (2013.01); *G01R 31/2601* (2013.01); *H01L 22/14* (2013.01); *H01L 24/49* (2013.01); *H01L 24/85* (2013.01); *H01L 29/4236* (2013.01); *H01L 29/66348* (2013.01); *H01L 29/7397* (2013.01); *H01L 2224/05624* (2013.01); *H01L 2224/45015* (2013.01); *H01L 2224/4813* (2013.01); *H01L 2224/85399* (2013.01); *H01L 2224/85801* (2013.01); *H01L 2924/00014* (2013.01); *H01L 2924/13055* (2013.01); *H01L 2924/13091* (2013.01)

(58) Field of Classification Search
CPC .................................................. H01L 29/0696
USPC ........................................................ 257/139
See application file for complete search history.

(56) References Cited

FOREIGN PATENT DOCUMENTS

| | | |
|---|---|---|
| JP | 2-10855 A | 1/1990 |
| JP | 2006-186154 A | 7/2006 |
| JP | 2010-50211 A | 3/2010 |
| JP | 2011-243695 A | 12/2011 |
| JP | 2013-251466 A | 12/2013 |

*Primary Examiner* — Anthony Ho
(74) *Attorney, Agent, or Firm* — Westerman, Hattori, Daniels & Adrian, LLP

(57) ABSTRACT

A fabrication method of a semiconductor device that includes trench gate structures each having a gate electrode extending in a depth-direction of an element, where first trench gate structures contribute to controlling the element and second trench gate structures do not contribute. The fabrication method includes forming the trench gate structures on a front face of a semiconductor substrate; forming on the front face, an electrode pad connected to the gate electrode of at least one trench gate structure; executing screening by applying a predetermined voltage between the electrode pad and an electrode portion having a potential other than a gate potential, to apply the predetermined voltage to gate insulator films in contact with each gate electrode connected to the electrode pad; and forming the second trench gate structures having the gate electrodes connected to the electrode pad, by short-circuiting the electrode portion to the electrode pad after executing screening.

9 Claims, 13 Drawing Sheets

FABRICATION METHOD OF SEMICONDUCTOR DEVICE, EVALUATION METHOD OF SEMICONDUCTOR DEVICE, AND SEMICONDUCTOR DEVICE

BACKGROUND OF THE INVENTION

1. Field of the Invention

The present invention relates to a fabrication method of a semiconductor device, an evaluation method of a semiconductor device, and a semiconductor device.

2. Description of the Related Art

Among semiconductor devices such as an insulated gate bipolar transistor (IGBT) and a metal oxide semiconductor field effect transistor (MOSFET) is a trench gate semiconductor device having a metal oxide semiconductor (MOS) gate structure in a trench. A trench gate semiconductor device has many trench MOS cells disposed on a semiconductor substrate at predetermined intervals, each having a MOS gate structure formed in a trench to form a channel region (an inversion layer) in a trench side wall.

Each of the trench MOS cells disposed on the semiconductor substrate is usually at a gate potential. When all of the trench MOS cells operate concurrently, however, a problem arises in that an excessive flow of saturated current causes a parasitic thyristor to latch up and an effective parasitic capacitance Qg to increase, whereby switching loss increases. Thus, a device has been proposed that is configured to have the trench MOS cells not densely disposed therein by reducing (culling) the number of trench MOS cells, whereby the interval between adjacent trench MOS cells is increased. When the trench MOS cells are culled, however, a problem arises in that the electric field concentration increases at the bottom portion of the trench and the breakdown voltage of the element decreases.

As a device to solve the problems above, a device has been proposed which trench MOS cells that form no channel region in the trench side wall (hereinafter, respectively referred to as a "dummy trench MOS cell") are disposed therein in addition to the trench MOS cells that are at the gate potential, and a dummy gate electrode constituting the dummy trench MOS cell is short-circuited (shorted) to an emitter electrode. The number of trench MOS cells each at the gate potential can be reduced by disposing the dummy trench MOS cells that are at the emitter potential without culling the trench MOS cells. Thus, increases in the effective parasitic capacitance Qg can be prevented and the electric potential concentration at the bottom portion of the trench can be alleviated.

In the fabrication process of the trench gate semiconductor device, usually, during wafer inspection after the wafer process, screening is executed to evaluate the reliability of the gate insulator film by applying a predetermined voltage to the gate insulator film of the trench side wall by applying a voltage between the gate electrode in the trench and a semiconductor portion sandwiched between the trenches. No potential difference is, however, generated between a dummy gate electrode and the semiconductor portion sandwiched between the trenches because the dummy gate electrode constituting the dummy trench MOS cell is at a potential other than the gate potential (for example, the emitter potential). Therefore, in a conventional screening, no voltage can be applied to the dummy gate insulator film constituting the dummy trench MOS cell and consequently, the reliability of the dummy gate insulator film cannot be measured.

As a screening method for evaluating the reliability of the dummy gate insulator film constituting the dummy trench MOS cell, a method has been proposed according to which the dummy gate electrode constituting the dummy trench MOS cell is connected to a dummy gate pad, a DC power source is connected between an emitter pad and a dummy gate pad during the wafer inspection after the wafer process, and thereby, voltage is applied to the dummy gate insulator film (see, for example, Japanese Laid-open Publication No. 2013-251466).

The following method has been proposed as another screening method. An outer peripheral region disposed around a cell region is used as a region to run the wires of an IGBT element and a diode element. This outer peripheral region has plural pads disposed thereon to which the active regions respectively between the trenches are connected and that electrically connect the gate electrode and the trench electrode to the exterior. The gate electrodes and the trench electrodes are each electrically connected to the pads (see, for example, Japanese Laid-open Publication No. 2011-243695 (paragraphs 0034 to 0036)).

The following method has been proposed as yet another screening method. A first floating wiring is formed in a two-layer structure such that in the lower layer portion, portions are distant from each other by a predetermined interval (portions such as a portion electrically connected to doped Poly-Si that leads to the dummy gate electrode, and a portion electrically connected to a first floating layer). The screening inspection step is executed prior to the formation of the upper layer portion (see, for example, Japanese Laid-open Publication No. 2010-050211).

According to Japanese Laid-open Publication Nos. 2013-251466 and 2011-243695, the dummy gate electrode and the exterior are configured to be electrically connected to each other and external parts are necessary such as, for example, a driver circuit to control the potential of the dummy gate electrode.

As a method of connecting predetermined electrodes to each other, a method has been proposed that includes a step of forming, among plural conductive patterns, one conductive pattern and other plural conductive patterns respectively disposed to be distant from the one conductive pattern and to sandwich the one conductive pattern, a step of coating at least the portion of the one conductive pattern sandwiched by the other conductive patterns with an insulating material, and a step of electrically connecting the other conductive patterns to each other above the points coated by the insulating material, by non-electrolytic plating (see, for example, Japanese Laid-open Publication No. 2006-186154).

As another method of connecting predetermined electrodes to each other, a method has been proposed that includes a step of forming for each device, a bridging point disposed linking each of the plural devices and configured by a metal pad adjacent to and distant from each of the devices to electrically isolate the devices, a step of distinguishing faulty devices and acceptable devices from each other by individually testing the devices and measuring the functionality of each of the devices in terms of predetermined operation parameters, a step of preventing solder leakage by coating the bridging points of the faulty devices by a coating fluid, and a step of electrically isolating the faulty devices by applying solder to the devices overall to bridge adjacent and distant metal pads by solder and thereby, electrically connect the bridging points of the acceptable devices (see, for example, Japanese Laid-open Publication No. H2-010855).

With Japanese Laid-open Publication No. 2010-050211, however, fine processing for metal wires is necessary to form the structure in which portions are separated by the predetermined interval such as the portion electrically connected to the doped Poly-Si that leads to the dummy gate electrode and a portion electrically connected to the first floating layer, in the lower layer portion of the floating wiring (the metal wiring) in the active region and the runner wiring portion. Susceptible to the effects of process variability, the metal wires formed to be separated by the predetermined interval may be short-circuited to each other. The reliability of the dummy gate insulator film cannot be evaluated by the screening and a problem arises in that the failure rate of the product after the product is put in the market (hereinafter, referred to as "market failure rate") increases.

SUMMARY OF THE INVENTION

It is an object of the present invention to at least solve the above problems in the conventional technologies.

A fabrication method according to one aspect of the present invention is a fabrication method of a semiconductor device that includes plural trench gate structures each having a gate electrode extending in a depth direction of an element, the plural trench gate structures including first trench gate structures respectively contributing to control of the element and second trench gate structures respectively not contributing to the control of the element. The fabrication method of a semiconductor device includes forming the plural trench gate structures on a front face of a semiconductor substrate; forming on the front face of the semiconductor substrate, an electrode pad connected to the gate electrode of at least one of the trench gate structures among the plural trench gate structures; executing screening by applying a predetermined voltage between the electrode pad and an electrode portion having a potential other than a gate potential, to apply the predetermined voltage to gate insulator films in contact with each gate electrode connected to the electrode pad; and forming the second trench gate structures respectively having the gate electrode connected to the electrode pad, by short-circuiting the electrode portion and the electrode pad to each other after executing screening.

The other objects, features, and advantages of the present invention are specifically set forth in or will become apparent from the following detailed description of the invention when read in conjunction with the accompanying drawings.

DETAILED DESCRIPTION OF THE PREFERRED EMBODIMENTS

Figure 1:
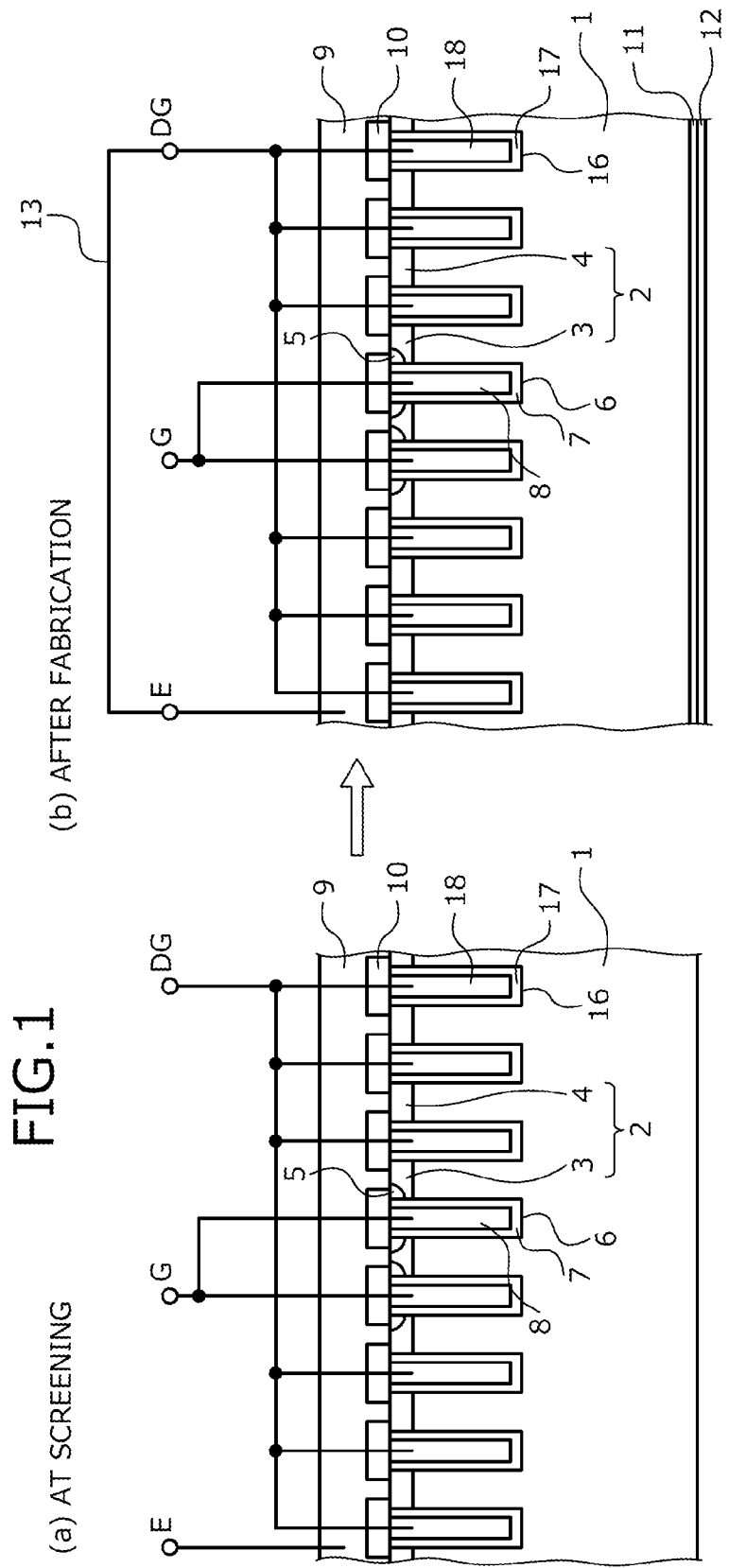
FIG. 1 is a cross-sectional view of an example of a semiconductor device fabricated using a fabrication method of a semiconductor device according to a first embodiment.

A preferred embodiment of a semiconductor device, an evaluation method of a semiconductor device, and a fabrication method of a semiconductor device according to the present invention will be described below with reference to the accompanying drawings. In the present specification and the accompanying drawings, layers and regions prefixed with "n" or "p" mean that majority carriers are electrons or holes, respectively. Additionally, "+" and "−" appended to "n" or "p" mean that the impurity concentration is higher and lower, respectively, than layers and regions without "+" and "−". In the description of the embodiment below and the accompanying drawings, identical constituent elements will be given the same reference numerals and will not repeatedly be described.

The structure of the trench gate IGBT will be described as an example of a semiconductor device produced (fabricated) using the fabrication method of a semiconductor device according to the first embodiment. FIG. 1 is a cross-sectional view of an example of a semiconductor device fabricated using the fabrication method of a semiconductor device according to the first embodiment. (a) of FIG. 1 schematically depicts the state of screening during the fabrication. (b) of FIG. 1 schematically depicts the state thereof after the fabrication. As depicted in FIG. 1, the semiconductor device according to the first embodiment includes trench MOS cells each having a trench 6 side wall to be a channel region (an inversion layer) (first trench gate structures) and trench MOS cells each having a trench (hereinafter, referred to as "dummy trench") 16 side wall forming no channel region therein (hereinafter, referred to as "dummy trench MOS cells" (second trench gate structures)), on an n$^-$-type semiconductor substrate (a semiconductor chip) 1 to be an n$^-$-type drift layer.

For example, a p-type base layer 2 is disposed in a surface layer of the front face of the n$^-$-type semiconductor substrate 1 in an active region through which current flows in an "on" state. The p-type base layer 2 is divided into plural regions (hereinafter, referred to as "a first and a second base regions") 3 and 4 by the plural trenches reaching the n$^-$-type drift layer penetrating the p-type base layer 2 in the depth direction from the front face of the substrate. The plural trenches are disposed in, for example, a planar pattern in stripes extending in a direction parallel to the front face of the substrate. The plural trenches include one or more trench(s) 6 each having the trench MOS cell formed therein and the remaining dummy trenches 16 each having the dummy trench MOS cell formed therein.

The trench MOS cell forms a trench gate MOS gate structure that includes a gate electrode 8 extending in the depth direction of the element. For example, the trench MOS cell includes a first base region 3, an $n^+$-type emitter region 5, the trench 6, a gate insulator film 7, and the gate electrode 8. The first base region 3 is a portion sandwiched between the trench 6 and the dummy trench 16 that are adjacent to each other, and between the adjacent trenches 6, of the p-type base layer 2. The $n^+$-type emitter region 5 is selectively disposed to be exposed on the trench 6 side wall inside the first base region 3. The gate insulator film 7 is disposed along the side wall of the trench 6 inside the trench 6, and the gate electrode 8 is disposed on the inner side of the gate insulator film 7. For example, all the gate electrodes 8 are electrically connected to a gate pad G through a generally used gate runner (not depicted) disposed on the front face of the substrate to surround the active region. The gate electrodes 8 and the dummy gate runner described later are electrically insulated from each other by, for example, an interlayer insulator film 10 covering the gate electrodes 8.

On the other hand, the dummy trench MOS cell forms a trench gate MOS gate structure that includes a dummy gate electrode 18 extending in the depth direction of the element and that does not contribute to the control of the element. For example, the dummy trench MOS cell includes a second base region 4, the dummy trench 16, a dummy gate insulator film 17, and the dummy gate electrode 18. The second base region 4 is a portion sandwiched between the adjacent dummy trenches 16 of the p-type base layer 2. The $n^+$-type emitter region 5 is not disposed in the second base region 4. The dummy gate insulator film 17 is disposed along the side wall of the dummy trench 16 and the dummy gate electrode 18 is disposed inside the dummy gate insulator film 17.

The dummy gate electrode 18 is electrically insulated from the gate electrode 8 by the dummy gate insulator film 17 and the interlayer insulator film 10. All the dummy gate electrodes 18 are electrically connected to an electrode pad (hereinafter, referred to as "screening pad") DG disposed for the screening through, for example, a dummy gate runner (not depicted) disposed in the configuration same as that of the gate runner inside or outside the gate runner. The dummy gate electrode 18 and the gate runner are electrically insulated by, for example, the interlayer insulator film 10 covering the dummy gate electrode 18. When the product is completed, the dummy gate electrode 18 is short-circuited to an electrode portion having the potential other than the gate potential (such as, for example, an external circuit (not depicted) or an emitter electrode 9 described later) through the screening pad DG. Description will be made taking an example of a case where the emitter electrode 9 and the dummy gate electrode 18 are short-circuited to each other. Although the size of the screening pad DG can be changed variously, the non-effective region not engaged in the operation of the element can be reduced by setting the size to be as small as possible.

The emitter electrode 9 is in contact with the first and the second base regions 3 and 4, and the $n^+$-type emitter region 5 through a contact hole penetrating the interlayer insulator film 10 in the depth direction, and is electrically insulated from the gate electrode 8 by the interlayer insulator film 10. During the screening to measure the breakdown voltages of the gate insulator film 7 and the dummy gate insulator film 17, the emitter electrode 9 is electrically insulated from the dummy gate electrode 18 ((a) of FIG. 1). On the other hand, after the screening and until the completion of the product after the fabrication, the emitter electrode 9 is short-circuited to the screening pad DG by a metal member (a plated film 13 described later) and thereby, is short-circuited to the dummy gate electrode 18 as described above ((b) of FIG. 1). The thickness of the emitter electrode 9 may be, for example, greater than or equal to 0.5 μm and less than or equal to 10 μm.

The plated film 13 is formed to cover the emitter electrode 9 and the screening pad DG, and short-circuits the emitter electrode 9 and the screening pad DG to each other. The thickness of the plated film 13 may be, for example, greater than or equal to 0.5 μm and less than or equal to 10 μm. The plated film 13 has a function of increasing the adhesiveness of a solder layer (not depicted) when, for example, a copper (Cu) block (not depicted) to be an electrode terminal is soldered to the emitter electrode 9 and the screening pad DG. On the front face of the $n^-$-type semiconductor substrate 1, a polyimide film is disposed as a front face protective film (not depicted) that extends from an edge termination structure portion surrounding the active region, to the active region and that covers the edge termination structure portion and a portion on the side of the edge termination structure portion of the active region. The edge termination structure portion is a region that alleviates the electric field on the front face side of the substrate of the $n^-$-type drift layer to maintain the breakdown voltage.

A $p^+$-type collector layer 11 is disposed in the surface layer of the back face of the $n^-$-type semiconductor substrate 1. An n-type field stopping layer (not depicted) may be disposed at a position deeper than the $p^+$-type collector layer 11 in the surface layer of the back side of the $n^-$-type semiconductor substrate 1. The n-type field stopping layer has a function of suppressing a depletion layer extending from a p-n junction on the front face side of the substrate (a p-n junction between the first base region 3 and the $n^-$-type drift layer) not to reach the $p^+$-type collector layer 11 during an "off" time period. The collector electrode 12 is in contact with the $p^+$-type collector layer 11.

The dummy gate electrode 18 and the emitter electrode 9 are electrically insulated from each other as described above during the screening to measure the breakdown voltage of the gate insulator film 7 and the dummy gate insulator film 17 in the course of fabrication of the semiconductor device according to the first embodiment ((a) of FIG. 1). The dummy gate electrode 18 is electrically insulated (separated) from the first and the second base regions 3 and 4. The screening can, therefore, be executed to evaluate the reliability of the dummy gate insulator film 17 by applying a predetermined voltage between the dummy gate electrode 18 and, for example, the second base region 4 facing the dummy gate electrode 18 through the dummy gate insulator film 17 of the side wall of the dummy trench 16 (or the first base region 3 when the dummy gate electrode 18 is disposed at a position next to the gate electrode 8) and measuring the breakdown voltage of the dummy gate insulator film 17.

For example, the predetermined voltage is applied between the screening pad DG connected to all the dummy gate electrodes 18, and the emitter electrode 9 connected to the first and the second base regions 3 and 4 for the screening to evaluate the reliability of the dummy gate insulator film 17. The predetermined voltage applied between the dummy gate electrode 18 and the emitter electrode 9 during the screening only has to be equal to or higher than the voltage to be applied to the dummy gate electrode 18 during the use of the product and lower than the breakdown voltage of the dummy gate insulator film 17. Although not particularly limited hereto, for example, when the thickness of the dummy gate insulator film 17 is about 1,000 Å, the breakdown voltage is about 80 V. A voltage of about 15 V is usually applied to the dummy gate insulator film 17 during the use of the product. Therefore, the predetermined voltage that is applied between the dummy gate electrode 18 and the emitter electrode 9 during the screening may be equal to or higher than 15 V and lower than 80 V.

At the screening, the semiconductor chips whose dummy gate insulator films 17 may break consequent to deterioration over time caused by factors such as partial reduction of the thickness of the dummy gate insulator films 17, merely have to be removed. In other words, the semiconductor chips that can endure deterioration over time and that are likely not to fail, merely have to be identified by the screening. For example, when the dummy gate insulator films 17 are faulty, no semiconductor chip that will become faulty can be detected in a commonly used wafer inspection, and the dummy gate insulator films 17 may break at a voltage lower than the predetermined breakdown voltage consequent to deterioration over time. The breakdown voltage of the dummy gate insulator film 17 is usually set to be sufficiently higher than the voltage that may actually be applied to the dummy gate insulator film 17 during the use of the product, usually taking into consideration the safety margin against deterioration over time. The predetermined voltage applied between the dummy gate electrode 18 and the emitter electrode 9 during the screening merely has to have a voltage value greater than the rated voltage (the upper limit value set in the product specification), and may be a value less than the breakdown voltage of the dummy gate insulator film 17. For example, when the rated voltage is 15 V, the predetermined voltage applied between the dummy gate electrode 18 and the emitter electrode 9 during the screening may be about 20 V or about 30 V, or may be equal to or less than 80% of the breakdown voltage of the dummy gate insulator film 17 ($\approx$65 V).

Figure 2:
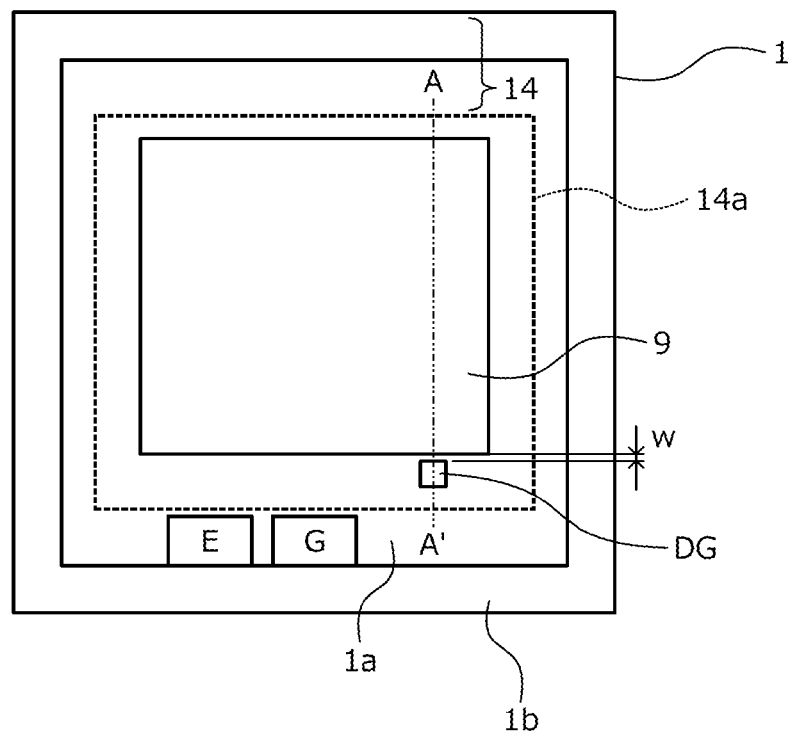
FIG. 2 is a plan view of a layout of electrode pads of the semiconductor device according to the first embodiment.
Figure 3:
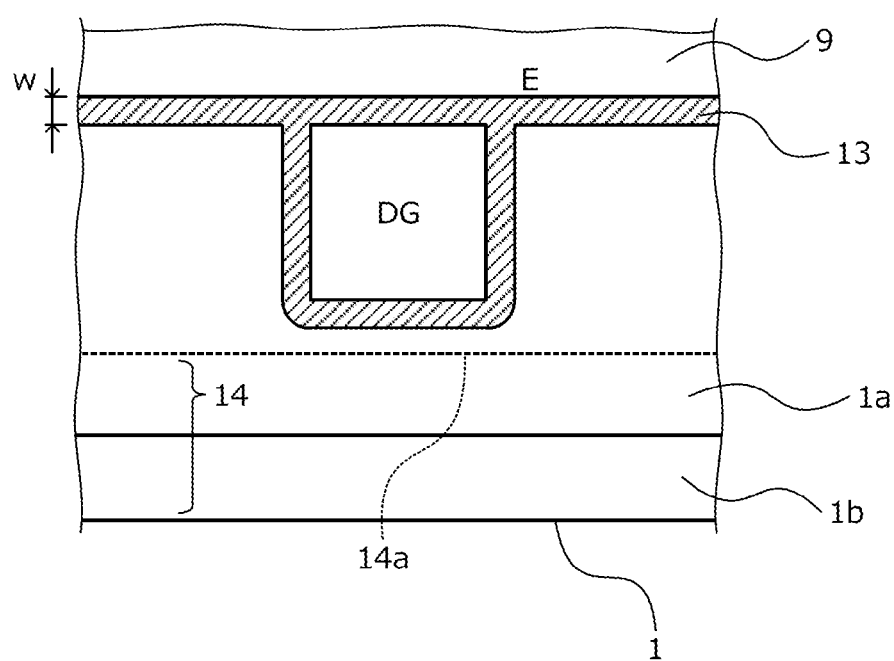
FIG. 3 is an enlarged plan view of a vicinity of a screening pad depicted in FIG. 2.
Figure 4:
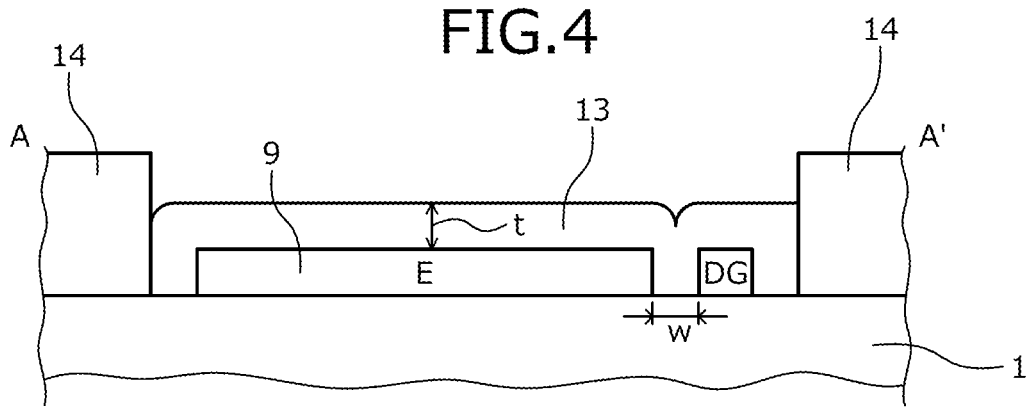
FIG. 4 is a cross-sectional view along a cutting line A-A' in FIG. 2.

When the semiconductor device according to the first embodiment is completed, the emitter electrode 9 and the screening pad DG are short-circuited to each other by the plated film 13 as described above. Arrangement of the screening pad DG will be described for a case where the plated film 13 is used as the metal member to short-circuit the emitter electrode 9 and the screening pad DG. FIG. 2 is a plan view of a layout of the electrode pads of the semiconductor device according to the first embodiment. FIG. 3 is an enlarged plan view of the vicinity of the screening pad depicted in FIG. 2. FIG. 4 is a cross-sectional view along a cutting line A-A' in FIG. 2. In FIG. 2, the plated film 13 is not depicted (and is also not depicted in FIGS. 6 and 7).

As depicted in FIGS. 2 to 4, the emitter electrode 9 is disposed, for example, in a vicinity of a center of an active region 1a. An emitter pad E is an auxiliary pad at a potential equal to that of the emitter electrode 9 to cause the main current to flow therethrough. Commonly used electrode pads such as the emitter pad E and the gate pad G are disposed outside an inner termination end 14a of a front face protective film 14 (for example, in a vicinity of the boundary to an edge termination region 1b in the active region 1a). Respectively on the gate pad G, the emitter pad E, etc., an opening of the front face protective film 14 (not depicted) is formed at each point at which a wire and the like is to be bonded. The screening pad DG is disposed, for example, in a vicinity of the outer periphery of the emitter electrode 9 being separated from the emitter electrode 9 by a predetermined interval w. One perimeter edge of the substantially rectangular screening pad DG faces the emitter electrode 9.

The screening pad DG merely has to be disposed at a position that enables the short-circuiting to the emitter electrode 9, and may be disposed in the active region or may be disposed in the edge termination region. Preferably, the screening pad DG is disposed on the inner side of the inner termination end (the inner end) 14a of the front face protective film 14 (on the chip center portion side). The reason why, preferably, the screening pad DG is disposed on the inner side of the inner termination end 14a of the front face protective film 14 is as follows. The plated film 13 is formed on the emitter electrode 9 and the screening pad DG. The plated film 13 spreads out in a manner based on the wetting thereof (hereinafter, referred to as "wet-spread") on the overall front face of the substrate from the central portion side of the substrate to the inner termination end 14a of the front face protective film 14. The gap between the emitter electrode 9 and the screening pad DG can, therefore, be assuredly filled with the plated film 13 by disposing the screening pad DG on the inner side of the inner termination end 14a of the front face protective film 14.

The interval w between the emitter electrode 9 and the screening pad DG is substantially a dimension for the emitter electrode 9 and the screening pad DG to be short-circuited to each other through the plated film 13 wet-spreading from the positions on the emitter electrode 9 and the screening pad DG. For example, the plated film 13 spreads out from the emitter electrode 9 to the screening pad DG and from the screening pad DG and the emitter electrode 9 in a width substantially equal to the thickness t of the plated film 13 (the thickness of its portions on the emitter electrode 9 and the screening pad DG). The interval w between the emitter electrode 9 and the screening pad DG, therefore, merely has to be less than or equal to a length that is twice as great as the thickness t of the plated film 13 (w≤2t). For example, the thickness t of the plated film 13 may be about 5 µm and the interval w between the emitter electrode 9 and the screening pad DG may be less than or equal to about 10 µm.

Figure 5:
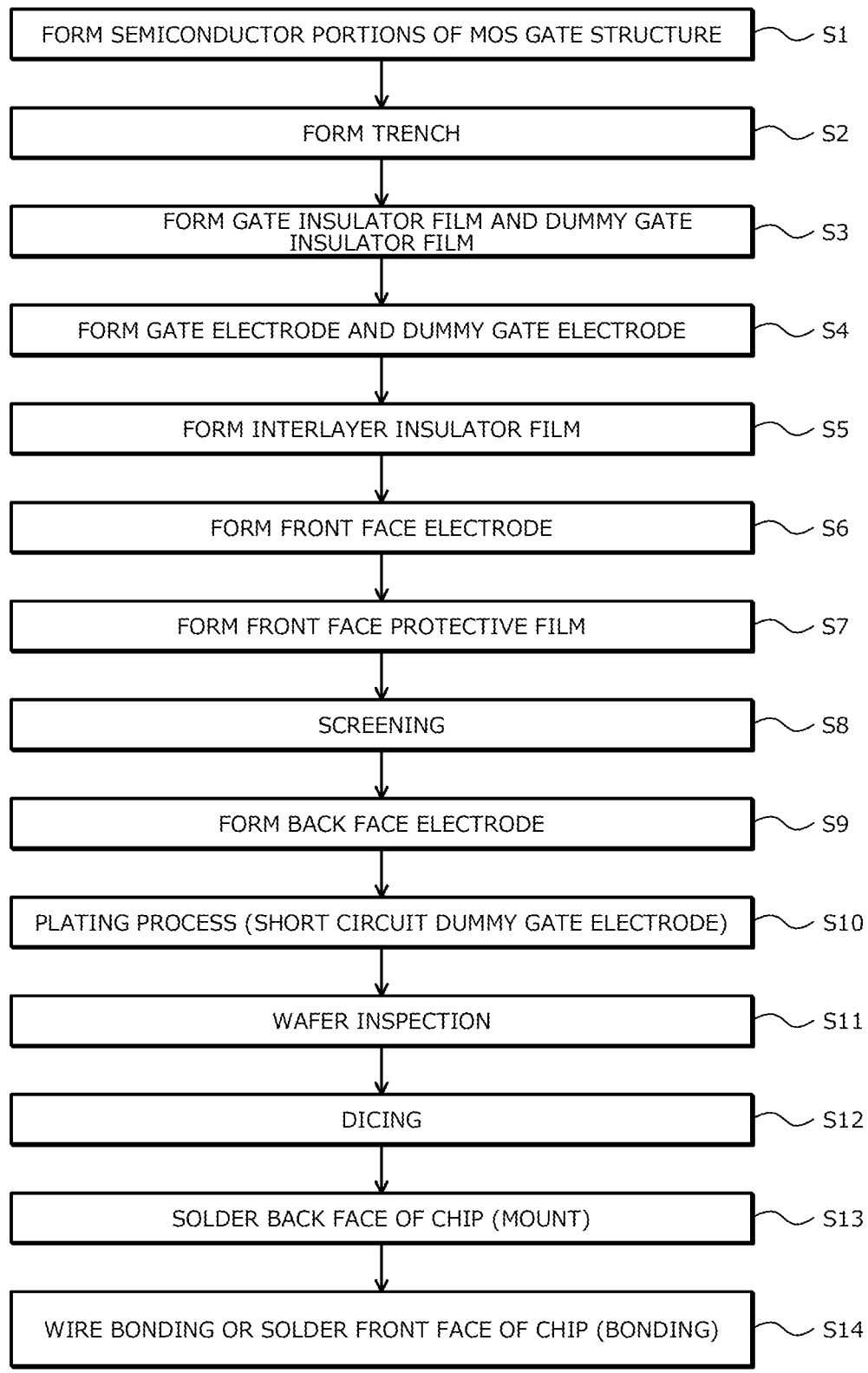
FIG. 5 is a flowchart of an overview of the fabrication method of a semiconductor device according to the first embodiment.

The fabrication method of a semiconductor device according to the first embodiment will be described in detail. FIG. 5 is a flowchart of an overview of the fabrication method of a semiconductor device according to the first embodiment. The trench MOS cells respectively forming the channel region in the trench side wall and the dummy trench MOS cells respectively forming no channel region in the trench side wall are formed on the front face side of the n$^-$-type semiconductor wafer to be the n$^-$-type drift layer, according to a generally used method. For example, the semiconductor portions (the p-type base layer 2 and the n$^+$-type emitter region 5) constituting the MOS gate structure are formed in the surface layer of the front face of the n$^-$-type semiconductor wafer in the active region 1a (step S1).

The trench 6 is formed that penetrates the p-type base layer 2 and the p$^+$-type emitter region 5 in the depth direction from the front face of the wafer and that reaches the n$^-$-type drift layer, and the dummy trench 16 is formed that penetrates the p-type base layer 2 in the depth direction from the front face of the wafer and that reaches the n$^-$-type drift layer (step S2). At step S2, the trench 6 and the dummy trench 16 divide the p-type base layer 2 into the plural regions (the first and the second base regions 3 and 4). The gate insulator film 7 is formed along the inner wall of the trench 6 inside the trench 6, and the dummy gate insulator film 17 is formed along the inner wall of the dummy trench 16 inside the dummy trench 16 (step S3).

The poly-silicon (poly-Si) layer is formed on the front face of the n⁻-type semiconductor wafer, filling the inside of the trench 6 and the inside of the dummy trench 16. The poly-silicon layer is etched back to leave portions of the poly-silicon layer to be the gate electrode 8 and the dummy gate electrode 18 respectively inside the trench 6 and the dummy trench 16 (step S4). The interlayer insulator film 10 is formed to cover the front face of the wafer (step S5). The contact holes are formed by selectively removing the interlayer insulator film 10, and the first and the second base regions 3 and 4, and the n⁺-type emitter region 5 are exposed inside the contact holes.

Patterning is applied to, for example, an aluminum (Al) electrode (a front face electrode) formed on the overall front face of the wafer to fill therewith the contact holes to form the emitter electrode 9, the screening pad DG, and the electrode pads (step S6). After covering the front face of the wafer with the front face protective film 14 (step S7), patterning is applied to the front face protective film 14 to expose the emitter electrode 9, the screening pad DG, and the electrode pads. At this step, the emitter electrode 9 and the screening pad DG are exposed on the inner side of the inner termination end 14a of the front face protective film 14. At an arbitrary timing at a process step up to step S7, the gate electrodes 8 and the gate pad G are connected to each other through the gate runner, and the dummy gate electrodes 18 and the screening pad DG are connected to each other through the dummy gate runner.

The screening is executed to evaluate the reliability of the gate insulator film 7 and the dummy gate insulator film 17 (step S8). For example, for the screening to evaluate the reliability of the dummy gate insulator film 17, the predetermined voltage merely has to be applied between the emitter electrode 9 and the dummy gate electrode 18 and the breakdown voltage of the dummy gate insulator film 17 merely has to be measured as described above. The predetermined voltage is applied between the emitter electrode 9 and the screening pad DG. For the screening to evaluate the reliability of the gate insulator film 7, the predetermined voltage merely has to be applied between the emitter electrode 9 and the gate electrode 8 and the breakdown voltage of the gate insulator film 7 merely has to be measured. For example, voltage equal to that in the screening for the dummy gate insulator film 17 is applied between the emitter electrode 9 and the gate pad G. The result of the screening for each semiconductor chip is stored in a storage unit of an evaluating apparatus for the screening or an external storage unit as electronic information based on, for example, the individual ID number of the semiconductor wafer, and site information including the positions of the chips of the semiconductor wafer that are each converted into an address.

After forming the semiconductor portions on the back face side of the n⁻-type semiconductor wafer (the p⁺-type collector layer 11 and the n-type field stopping layer), the collector electrode 12 is formed that is in contact with the p⁺-type collector layer 11 as the back face electrode (step S9). The plated film 13 is formed on the emitter electrode 9 and the screening pad DG. At this step, the emitter electrode 9 and the screening pad DG are short-circuited (shorted) to each other using the wet-spreading of the plated film 13. The emitter electrode 9 and the dummy gate electrode 18 are shorted (step S10).

A commonly used wafer inspection is executed exclusive of the screening (step S11). At step S11, for example, a wafer acceptance test (WAT) that evaluates whether normal operation is achieved for each wafer by causing current to flow therethrough, etc., is executed as the wafer inspection. For example, the threshold voltage, the presence of leaking current, the ON-voltage, etc., are evaluated in the wafer inspection. At step S11, after the wafer inspection, marking is executed based on the electronic information stored to the storage unit in the screening at step S8 and the result of the wafer inspection, such that the semiconductor chips determined to be acceptable products and the semiconductor chips determined to be faulty can be distinguished from each other. For example, marking (attachment) of a predetermined mark such as a pattern, a character, or a bar code is executed for all the semiconductor chips that are determined to be faulty.

As described above, the marking for the semiconductor chips is executed after the plated film 13 is formed. Thereby, any adverse effect due to the marking for the semiconductor chips can be prevented from affecting the plating solution used to form the plated film 13. After the screening and until the wafer is diced into individual chips after undergoing the plating process to form the plated film 13, results of the screening can be assuredly maintained, and the predetermined marks attached to the semiconductor chips can, therefore, be accurately recognized even after the formation of the plated film 13. In the description above, although description has been made taking an example of a case where the results of the screening at step S8 are stored as electronic information, the marking for the semiconductor chips merely has to be executable after the formation of the plated film 13, and another method may be used.

The semiconductor wafer is diced (cut) into individual chips (step S12). At this step, the semiconductor chips are removed that are determined to be faulty in the screening at step S8 and the wafer inspection at step S11. For example, after the dicing of the semiconductor wafer, the semiconductor chips that are determined to be faulty and to which the predetermined marks are attached are left as they are on a stage (the stage on which the semiconductor wafer is placed during the dicing), and only the semiconductor chips determined to be acceptable products (that is, the semiconductor chips to which no predetermined mark is attached) are picked up (taken out) and are transferred for the next assembling process step.

A commonly used assembling process step is executed to mount the semiconductor chips each on a package. For example, the back face of the semiconductor chip is soldered (mounted) to an insulated substrate (not depicted) such as, for example, a direct copper bonding (DCB) substrate (step S13). Because only the semiconductor chips determined to be acceptable products are picked up as described above, no semiconductor chip determined to be faulty is mounted on the DCB substrate. Therefore, in the wiring step described later, there is no need to execute the wiring process to skip the semiconductor chips determined to be faulty, and the process step can be simplified. Thereafter, a wiring step is executed to connect the emitter electrode 9 and the emitter pad E to each other and to connect the emitter pad E and the gate pad G to predetermined electrode leads (not depicted) by wire bonding and by soldering of the front face of the chip to a copper block (not depicted) to be an electrode terminal (wireless bonding) (step S14). Thereby, the trench gate IGBT depicted in (b) of FIG. 1 is completed.

As described above, according to the first embodiment, for the MOS semiconductor device including the dummy trench cells at the potential other than the gate potential (for example, the emitter potential), the emitter electrode and the dummy gate electrode are electrically separated from each other until the screening is executed for the gate insulator films each of the second trench gate structure and thereby, during the fabrication process, the predetermined voltage can be applied between the emitter electrode and the dummy gate electrode, and the screening can be executed for the dummy gate insulator films. Consequently, after the dicing of the semiconductor wafer, the semiconductor chips can be removed that are determined to be faulty due to partial reduction of the thickness of the dummy gate insulator film, etc. According to the embodiment, the emitter electrode and the dummy gate electrode are short-circuited to each other in the process steps to fabricate the IGBT (for example, the plating process step executed for the front face electrode) after the screening for the dummy gate insulator films, and the product can, therefore, be completed having therein the emitter electrode and the dummy gate electrode of the trench gate structure short-circuited to each other at the end of the product process even when the screening for the dummy gate insulator films is executed during the fabrication process. The trench gate semiconductor device can be provided that includes the dummy trench MOS cells each having no channel region formed in the trench side wall and whose market failure rate is low.

Figure 6:
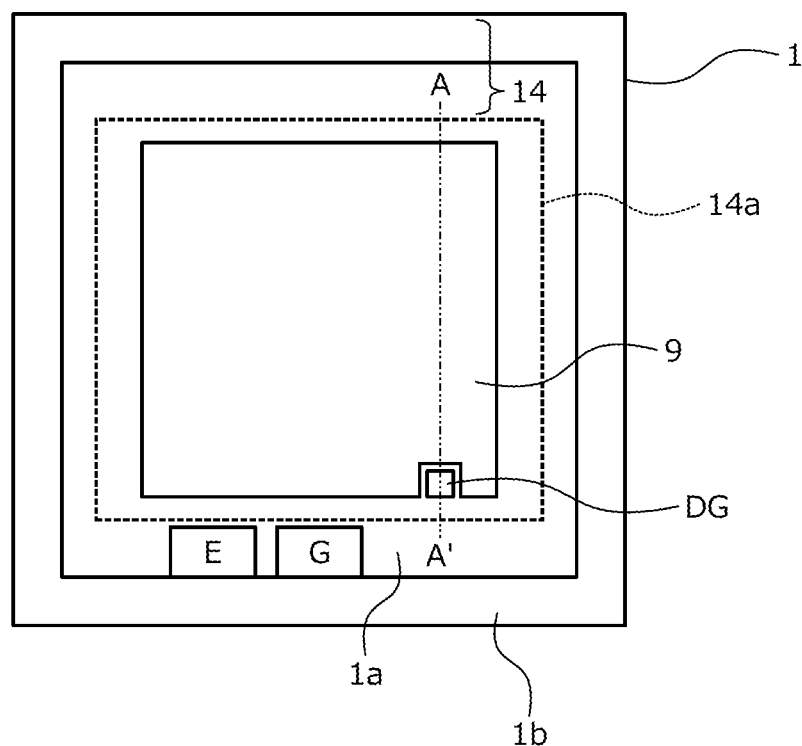
FIG. 6 is a plan view of a layout of the electrode pads of the semiconductor device according to a second embodiment.
Figure 7:
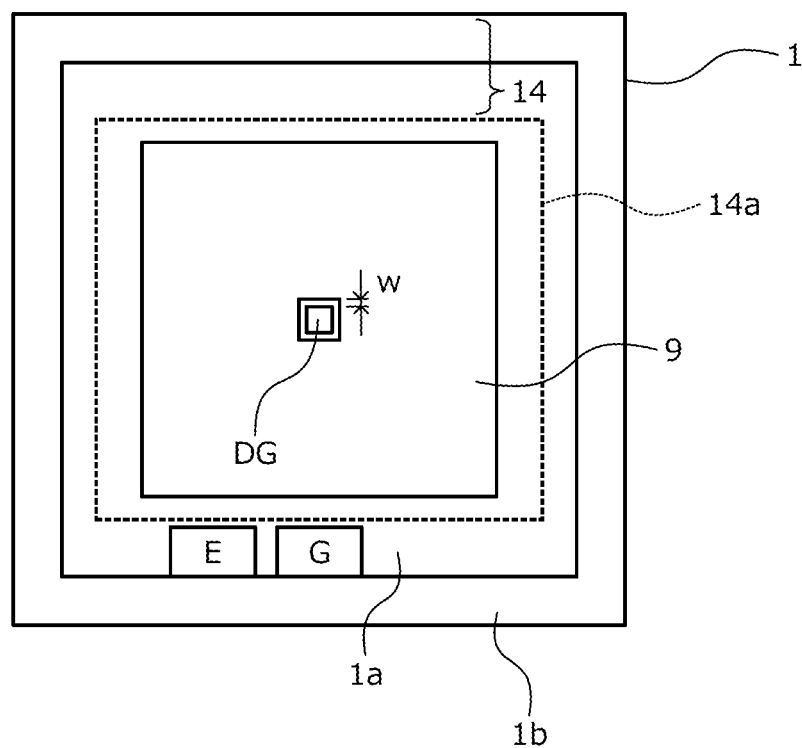
FIG. 7 is a plan view of another layout example of the electrode pads of the semiconductor device according to the second embodiment.
Figure 8:
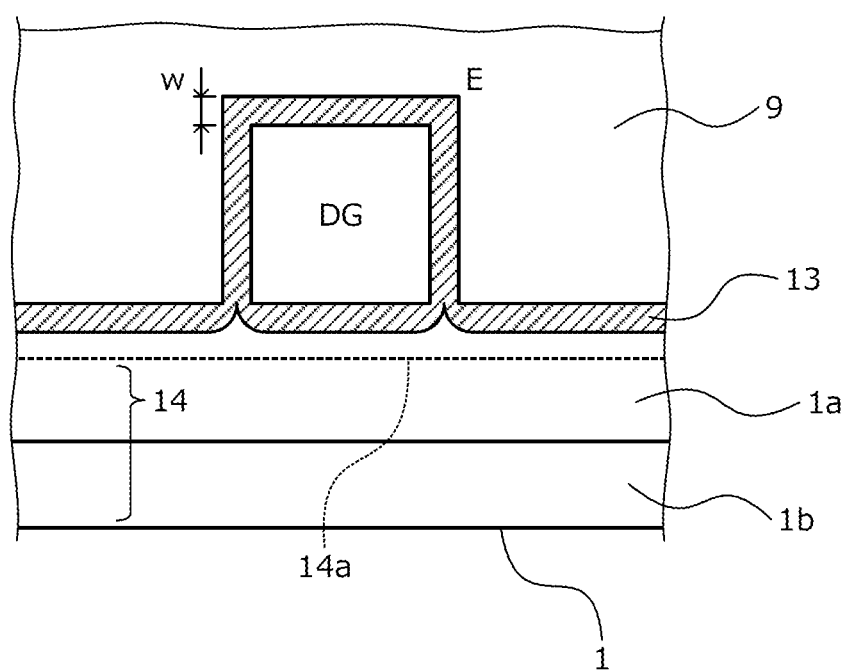
FIG. 8 is an enlarged plan view of a vicinity of the screening pad depicted in FIG. 6.

A structure of a semiconductor device will be described that is fabricated using a fabrication method of a semiconductor device according to a second embodiment. FIG. 6 is a plan view of a layout of the electrode pads of the semiconductor device according to the second embodiment. The cross-sectional view along a cutting line A-A' of FIG. 6 is same as that of the first embodiment (FIG. 4). FIG. 7 is a plan view of another layout example of the electrode pads of the semiconductor device according to the second embodiment. FIG. 8 is an enlarged plan view of a vicinity of the screening pad depicted in FIG. 6. The semiconductor device fabricated using the fabrication method of a semiconductor device according to the second embodiment differs from the semiconductor device fabricated using the fabrication method of a semiconductor device according to the first embodiment in that two or more perimeter sides of the screening pad DG face the emitter electrode 9.

For example, as depicted in FIG. 6, the screening pad DG is disposed, for example, on an outer peripheral portion of the emitter electrode 9 to have three perimeter sides facing the emitter electrode 9. As depicted in the other example in FIG. 7, the screening pad DG may be disposed in the central portion of the emitter electrode 9 and four perimeter sides may face the emitter electrode 9. As depicted in FIG. 8, the interval w between the screening pad DG and the emitter electrode 9 may be, for example, the same dimension for all three sides facing the emitter electrode 9 (though not depicted, for all four sides facing the emitter electrode 9 in the other example of FIG. 7) of the screening pad DG.

As described above, according to the second embodiment, the same effect as that of the first embodiment can be achieved.

Figure 9:
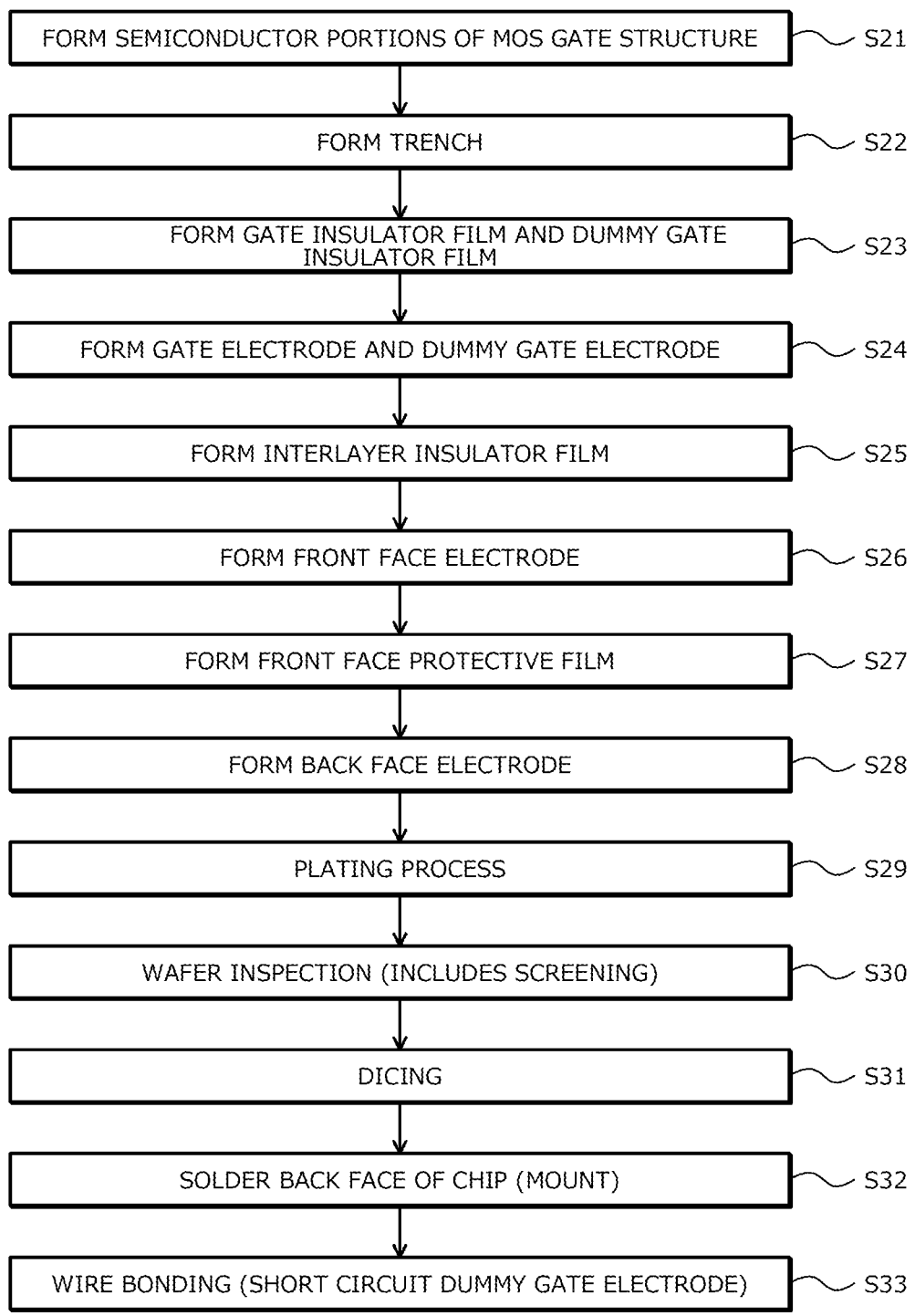
FIG. 9 is a flowchart of an overview of the fabrication method of a semiconductor device according to a third embodiment.
Figure 10:
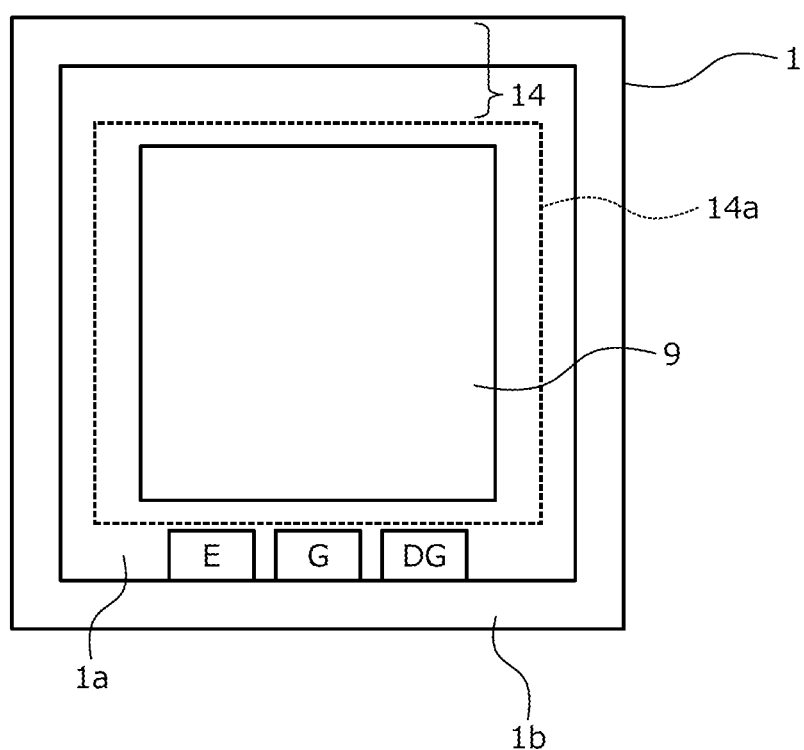
FIG. 10 is a plan view of a layout of the electrode pads of the semiconductor device according to the third embodiment.

The fabrication method of a semiconductor device according to a third embodiment will be described. FIG. 9 is a flowchart of an overview of the fabrication method of a semiconductor device according to the third embodiment. FIG. 10 is a plan view of a layout of the electrode pads of the semiconductor device according to the third embodiment. The fabrication method of a semiconductor device according to the third embodiment differs from the fabrication method of a semiconductor device according to the first embodiment on the following two points. The first different point is that the screening for the gate insulator film 7 and the dummy gate insulator film 17 is executed during the wafer inspection. The second different point is that the emitter electrode 9 and the screening pad DG are short-circuited by wire bonding.

For example, after sequentially executing the process steps from the step of forming the semiconductor portions that constitute the MOS gate structure to the step of forming the front face protective film 14 (steps S21 to S27), process steps are sequentially executed such as the step of forming the semiconductor portions on the back face side of the n$^-$-type semiconductor wafer, the step of forming the back face electrode (step S28), and the plating process step (step S29). In the third embodiment, the emitter electrode 9 and the screening pad DG are not short-circuited to each other in the plating process at step S29 because, for example, the interval w between the emitter electrode 9 and the screening pad DG is wider than the width of the wet-spreading of the plated film. The methods of forming these components in these process steps are same as those in the first embodiment.

The wafer inspection is executed (step S30). During the wafer inspection, the screening is executed for the gate insulator films 7 and the dummy gate insulator films 17. Based on the results of the wafer inspection (including the screening result), the marking is executed such that the semiconductor chips determined to be acceptable products and the semiconductor chips determined to be faulty can be distinguished from each other similar to the first embodiment. Items such as the screening method, the other wafer inspection methods, the method of marking the semiconductor chips to identify the acceptable products and the faulty products, and the timing of the marking for the semiconductor chips are the same as that in the first embodiment. The dicing step for the n$^-$-type semiconductor wafer and the soldering step for the chip back face are sequentially executed (steps S31 and S32) similar to the first embodiment. At the soldering step for the chip back face at step S32, only the semiconductor chips determined to be acceptable products are picked up and the back face of each semiconductor chip is soldered to the insulated substrate such as the DCB substrate. The semiconductor chips that are determined to be faulty (the semiconductor chips each attached with the predetermined mark) in the wafer inspection (including the screening) are removed at step S30. The emitter electrode 9 and the emitter pad E are connected to each other by wire bonding, and the emitter pad E and the gate pad G are connected to the predetermined electrode leads (not depicted) also thereby. The emitter electrode 9 and the screening pad DG are further connected to each other by wire bonding (step S33) and thereby, the trench gate IGBT depicted in (b) of FIG. 1 is completed.

In the third embodiment, a bonding wire (not depicted) is used as the metal member short-circuiting the emitter electrode 9 and the screening pad DG to each other. Similar to the other electrode pads, the screening pad DG may be disposed outside the inner termination end 14a of the front face protective film 14 (FIG. 10). When the screening pad DG is disposed on the inner side of the inner termination end 14a of the front face protective film 14 as in the first embodiment (FIG. 2), the screening pad DG and the emitter pad E may be short-circuited to each other by wire bonding. Preferably, the size (the surface area) of the screening pad DG has an aspect ratio of a substantial rectangular shape having, for example, the length of one side set to be greater than or equal to the wire diameter (for example, greater than or equal to about 30 μm and less than or equal to about 400 μm).

Figure 14:
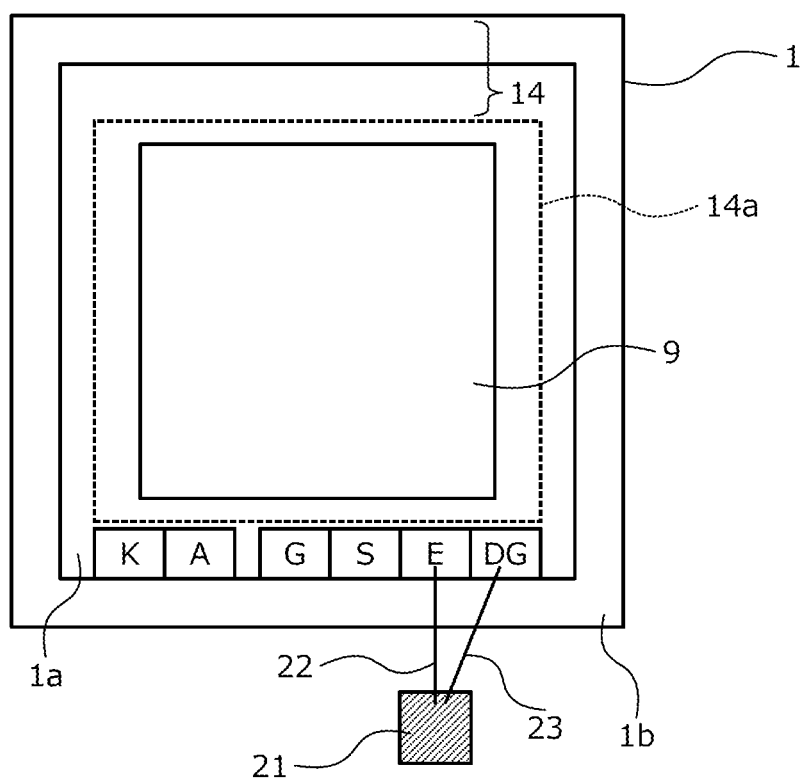
FIGS. 14, 15, and 16 are plan views of another layout example of the electrode pads of the semiconductor device according to the third embodiment.
Figure 15:
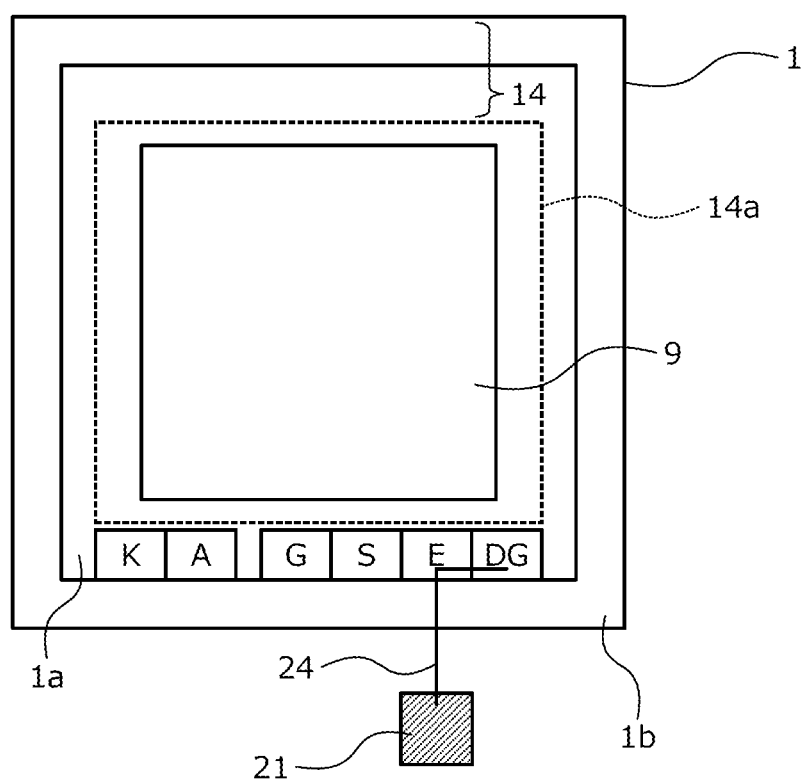
Figure 16:
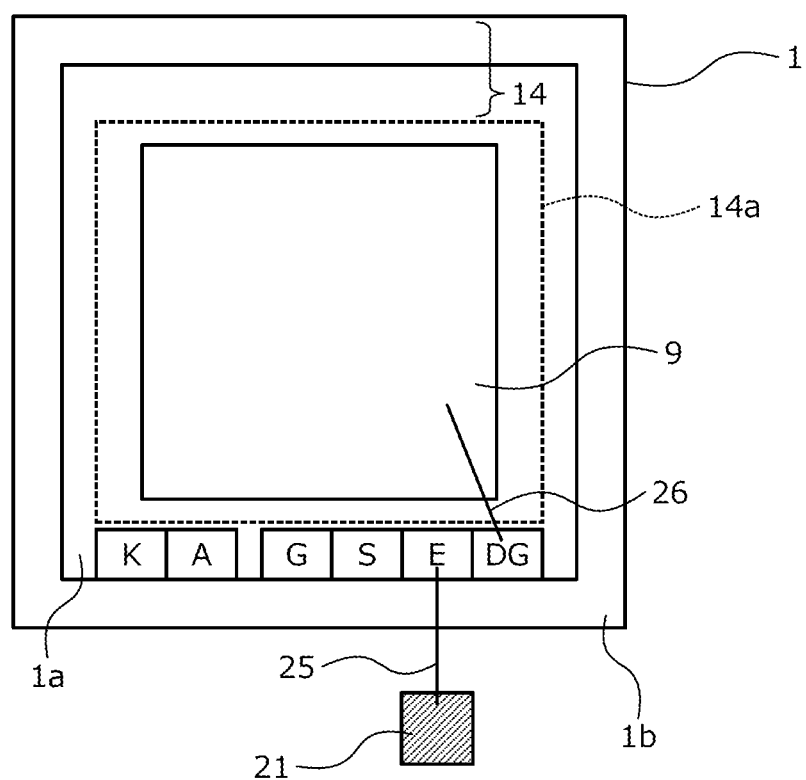

The screening pad DG and the emitter pad E may be short-circuited to each other by connecting the emitter pad E or the screening pad DG, or both to the wiring layer on the insulated substrate such as the DCB substrate by wire bonding. Description will be made taking an example of, for example, the semiconductor chip that includes a diode (a temperature sensing diode) used to measure the temperature of the semiconductor chip. FIGS. 14, 15, and 16 are plan views of another layout example of the electrode pads of the semiconductor device according to the third embodiment. The configuration of the semiconductor chip in FIGS. 14 to 16 is same as that of the semiconductor chip depicted in FIG. 10 except that the configuration includes the temperature sensing diode (not depicted) and that the screening pad DG and the emitter pad E are connected to the wiring layer on the insulated substrate.

As depicted in FIG. 14, the screening pad DG and the emitter pad E (the pad at a potential equal to that of the emitter electrode 9) may be disposed adjacent to each other, and the screening pad DG and the emitter pad E may be connected to, for example, a metal terminal including the wiring layer (a metal foil) 21 (hereinafter, referred to simply as "wiring layer") on the insulated substrate (not depicted), respectively, by different bonding wires 22 and 23. The metal terminal 21 is at, for example, a floating potential.

As depicted in FIG. 15, the screening pad DG and the emitter pad E may be disposed adjacent to each other, and the three points of the screening pad DG, the emitter pad E, and the wiring layer 21 may be connected (stitched) to each other by one bonding wire 24. In this case, for example, the first point (the screening pad DC or the wiring layer 21) and, for example, the emitter pad E disposed in the middle merely have to be bonded (ultra-sonic bonded) to each other by the bonding wire 24 and thereafter, the remaining third point merely has to be successively bonded using the bonding wire 24 without cutting the bonding wire. In this case, the number of bonding wires constituting a module can be reduced.

As depicted in FIG. 16, when the current value of the emitter electrode 9 is a relatively small current value, e.g., about several A, the screening pad DG and the emitter pad E may be disposed adjacent to each other, and the emitter pad E and the wiring layer 21 may be connected to each other by a bonding wire 25 and the emitter electrode 9 and the screening pad DG may be connected to each other by a lead frame 26. A lead frame connecting the emitter electrode 9 and the emitter pad E to each other is not depicted.

The screening pad DG and the emitter pad E are disposed, for example, outside the inner termination end 14$a$ of the front face protective film 14 similar to the other electrode pads. In FIGS. 14 to 16, "the other electrode pads" refer to a temperature sensing cathode pad K, a temperature sensing anode pad A, the gate pad G, and a current sensing pad S. The temperature sensing cathode pad K is connected to a cathode of the temperature sensing diode. The temperature sensing anode pad A is connected to an anode of the temperature sensing diode. The current sensing pad S is connected to a current sensing element disposed between the power source and the load, or between the ground and the load.

In the fabrication method of a semiconductor device according to the third embodiment, the screening may be executed for the gate insulator films 7 and the dummy gate insulator films 17 after the wire bonding at step S33 rather than during the wafer inspection at step S30. In this case, the screening pad DG may be short-circuited to, for example, an external circuit (not depicted) after the screening.

As described above, according to the third embodiment, the same effect as those in the first and the second embodiments can be achieved by executing the screening for the dummy gate insulator films before the assembling step and by short-circuiting the emitter electrode and the dummy gate electrode of the second trench gate structure in the assembling step.

Figure 11:
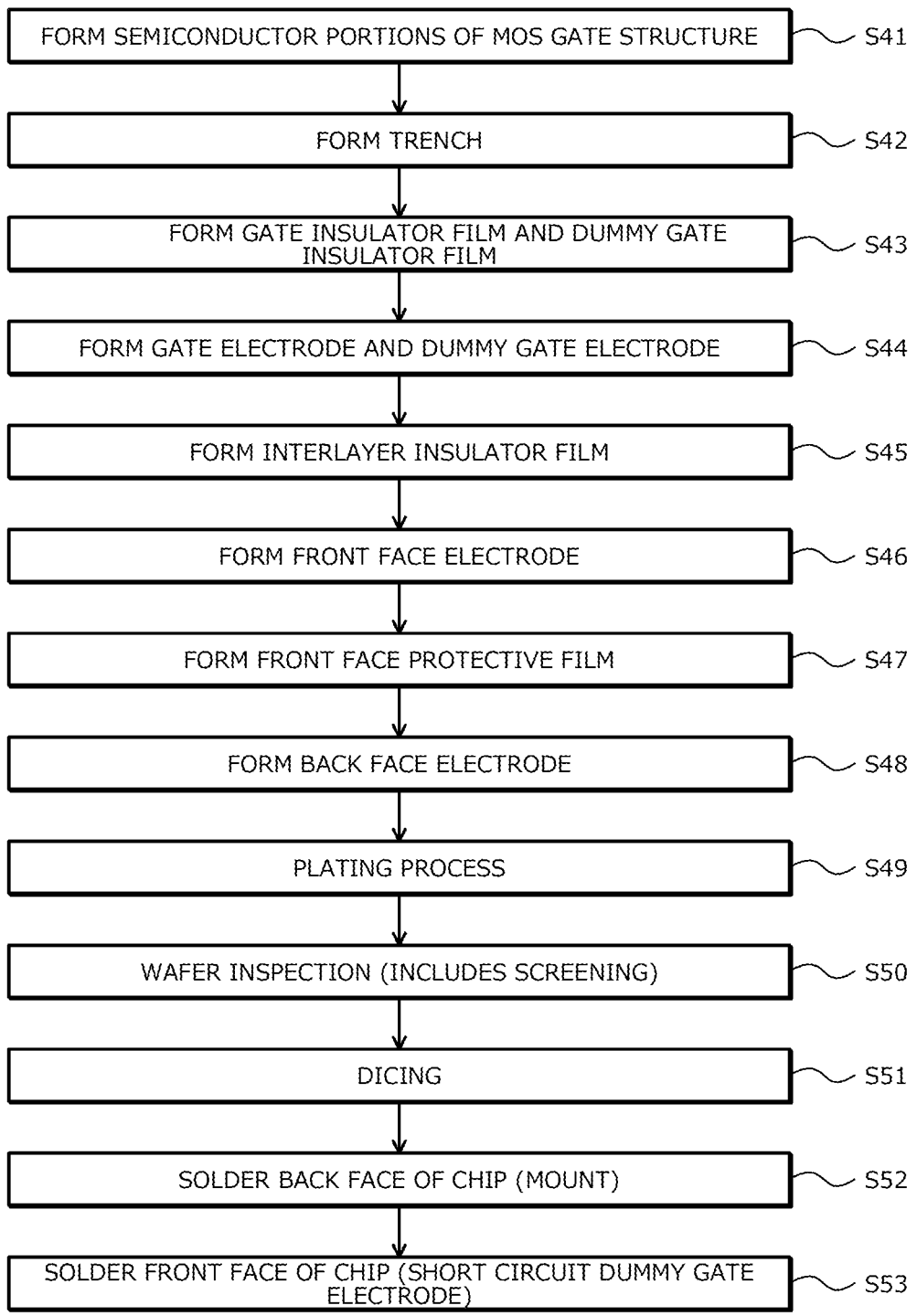
FIG. 11 is a flowchart of an overview of the fabrication method of a semiconductor device according to a fourth embodiment.
Figure 12:
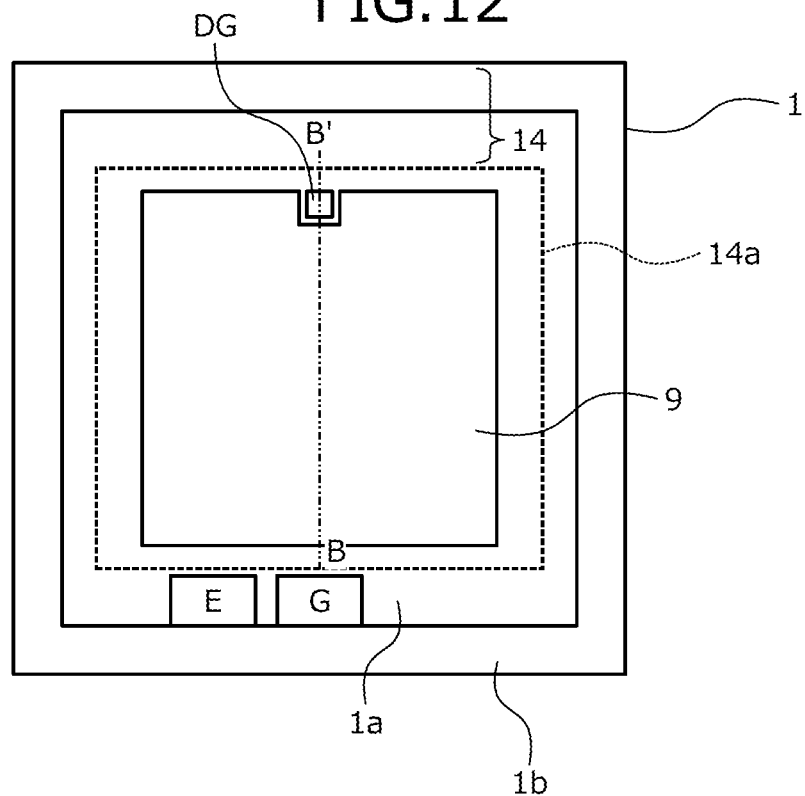
FIG. 12 is a plan view of a layout of the electrode pads of the semiconductor device according to the fourth embodiment.
Figure 13:
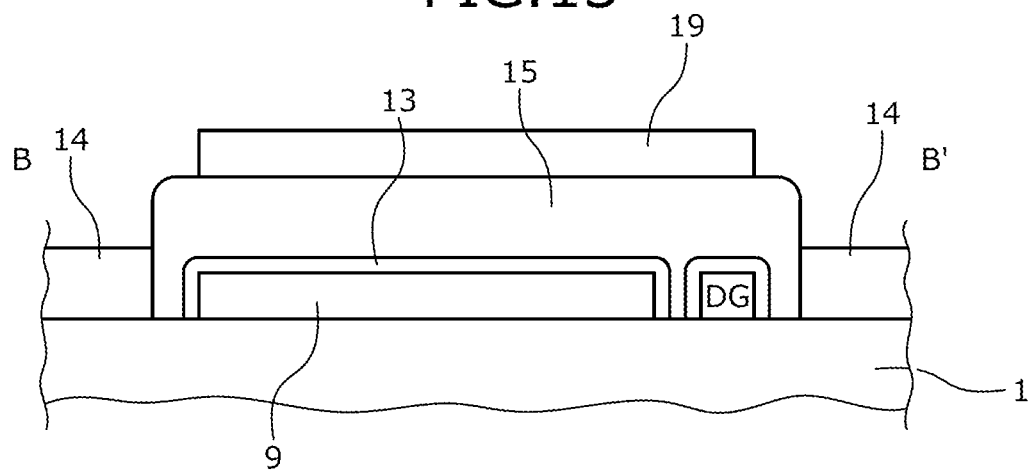
FIG. 13 is a cross-sectional view along a cutting line B-B' in FIG. 12.

The fabrication method of a semiconductor device according to a fourth embodiment will be described. FIG. 11 is a flowchart of an overview of the fabrication method of a semiconductor device according to the fourth embodiment. FIG. 12 is a plan view of a layout of the electrode pads of the semiconductor device according to the fourth embodiment. FIG. 13 is a cross-sectional view along a cutting line B-B' in FIG. 12. The fabrication method of a semiconductor device according to the fourth embodiment differs from the fabrication method of a semiconductor device according to the third embodiment in that the emitter electrode 9 and the screening pad DG are short-circuited to each other by soldering of the front face of the chip to the copper block 19 in the assembling step.

For example, similar to the third embodiment, the process steps are sequentially executed from the step of forming the semiconductor portions constituting the MOS gate structure to the step of soldering of the back face of the chip (steps S41 to S52). Similar to the third embodiment, in the fourth embodiment, the marking is also executed for the semiconductor chips to identify the acceptable products and the faulty products in the wafer inspection (including the screening) at step S50. At the soldering step for the back face of the chip at step S52, only the semiconductor chips determined to be the acceptable products are picked up and the back face of each of these semiconductor chips is soldered to the insulated substrate such as the DCB substrate. As depicted in FIG. 13, the emitter electrode 9 and the emitter pad E are connected to each other and the emitter pad E and the gate pad G are connected to the predetermined electrode leads (not depicted), through a solder layer 15 by soldering of the front face of the chip to the copper block 19. At this step, the emitter electrode 9 and the screening pad DG are further short-circuited to each other through the solder layer 15 (step S53). Thereby, the trench gate IGBT depicted in (b) of FIG. 1 is completed.

According to the fourth embodiment, the solder layer 15 is used as the metal member to short-circuit the emitter electrode 9 and the screening pad DG to each other. The solder layer 15 bonds the copper block 19 to the front face of the chip. The screening pad DG merely has to be disposed on the inner side of the inner termination end 14$a$ of the front face protective film 14. The reason for this is the same as that for the case where the plated film 13 is used as the metal member in the first embodiment. The solder layer 15 wet-spreads out over the overall area on the inner side of the inner termination end 14$a$ of the front face protective film 14, and the gap between the emitter electrode 9 and the screening pad DG can, therefore, be assuredly filled with the solder layer 15 (FIG. 13). This is especially effective for a case where the interval between the emitter electrode 9 and the screening pad DG is wide to the extent that the emitter electrode 9 and the screening pad DG are not short-circuited to each other by the wet-spreading out of the plated film 13 formed on the emitter electrode 9 and the screening pad DG. The thickness of the solder layer 15 may be, for example, greater than or equal to 50 μm and less than or equal to 200 μm. The thickness of the front face protective film 14 may be, for example, greater than or equal to 3 μm and less than or equal to 15 μm and, preferably, may be a thickness greater than the total of the thicknesses of the emitter electrode 9 and the plated film 13, such as, for example, 7 μm.

For example, similar to the first embodiment, the screening pad DG may be disposed in a vicinity of the outer periphery of the emitter electrode 9 such that one perimeter side of the screening pad DG faces the emitter electrode 9 (FIG. 2). Similar to the second embodiment, the screening pad DG may be disposed in the outer periphery of the emitter electrode 9 on the electrode pads side, or in a central portion of the emitter electrode 9 such that two or more perimeter sides of the screening pad DG face the emitter electrode 9 (FIGS. 6 and 7). The screening pad DG may be disposed on the opposite side of the electrode pads sandwiching the emitter electrode 9 therebetween (FIG. 12).

As described above, according to the fourth embodiment, the screening for the dummy gate insulator films is executed before the assembling step, and the emitter electrode and the dummy gate electrode of the second trench gate structure are short-circuited to each other in the assembling step. Thereby, the same effect as those of the first to the third embodiments can be achieved.

The fabrication method of a semiconductor device according to the fifth embodiment will be described with reference to FIG. 5. The fabrication method of a semiconductor device according to the fifth embodiment differs from the fabrication method of a semiconductor device according to the first embodiment in that all the trench gate structures are once formed as the trench MOS cells (that is, all the trench gate structures formed in the n⁻-type semiconductor substrate are all connected to the gate runner as the gate electrodes 8) and all the gate insulator films 7 are collectively screened and thereafter, a portion of the gate electrodes 8 connected to the gate runner are electrically separated to be used as the dummy gate electrodes 18.

For example, similar to the first embodiment, steps are sequentially executed such as the step of forming the semiconductor portions constituting the MOS gate structure and the step of forming the trench (steps S1 and S2). At steps S3 and S4, the gate electrodes used as the dummy gate electrodes 18 in a process step described later are also connected to the gate pad G through the gate runner at any timing up to the process at step S7 (described hereinafter), to be at the gate potential. At steps S3 and S4, the trench gate structure (the gate insulator film 7 and the gate electrode 8) at the gate potential are once formed in each of all the trenches.

Similar to the first embodiment, the process steps are sequentially executed from the step of forming the interlayer insulator film 10 to the step of forming the front face protective film 14 (steps S5 to S7). At step S8, the predetermined voltage is applied between the emitter electrode 9 and the gate pad G and thereby, the screening is executed for the gate insulator films 7 of all the trench gate structures. The screening is executed for the gate insulator films to be the gate insulator films 17 at a process step described hereinafter, as the gate insulator films 7. Similar to the first embodiment, the step of forming the back face electrode is executed (step S9).

After the screening at step S8 and prior to the plating process step at step S10 described later, a portion of the trench gate structures (the gate insulator films 7 and the gate electrodes 8) are electrically separated from the gate pad G by partially removing the gate runner by, for example, etching. The gate electrodes 8 separated from the gate pad G are connected to the screening pad DG through, for example, the dummy gate runner similar to the first embodiment and thereby, the dummy gate electrodes 18 are formed. Thereafter, the process steps at the plating process step and thereafter are sequentially executed similar to the first embodiment (steps S10 to S14) and thereby, the trench gate IGBT of (b) of FIG. 1 is completed.

The fabrication method of a semiconductor device according to a fifth embodiment may be applied to the second embodiment. The one or more perimeter side(s) of the screening pad DG merely has(have) to face the emitter electrode 9 respectively at the predetermined interval w, and the arrangement of the screening pad DG may be changed variously. The fabrication method of a semiconductor device according to the fifth embodiment may be applied to the third and the fourth embodiments. The portion of the gate electrodes 8 are electrically separated from the gate runner to be the dummy gate electrodes 18 after the execution of the screening for the gate insulator films 7 in the wafer inspection and before the bonding step. The arrangement of the screening pad DG may be changed variously depending on the type of the metal member used to short-circuit the emitter electrode 9 and the screening pad DG to each other.

As described above, according to the fifth embodiment, the same effect can be achieved as those of the first to the fourth embodiments.

In the description above, the present invention is not limited to the embodiments and can be changed variously within the scope not departing from the spirit of the invention. For example, in the embodiments, although description has been made taking an example of a case where the portion that is sandwiched by the dummy trench MOS cells in the p-type base region is set to be at the emitter potential, the present invention is also applicable to a MOS semiconductor device whose portions each sandwiched by dummy trench MOS cells in the p-type base region is set to be at a floating potential (floating potential). In the embodiments, although description has been made taking an example of a case where the screening for the gate insulator films is executed together with the execution of the screening for the dummy gate insulator films, the predetermined voltage may be applied to the gate insulator films at an arbitrary timing because the gate electrode constituting the trench MOS cell is not short-circuited to the emitter electrode. When the emitter electrode and the screening pad are electrically insulated from each other during the screening, all the trench gate structures formed in the n⁻-type semiconductor substrate may be connected to the dummy gate runner as the dummy gate electrodes and screening may be executed collectively for all the dummy gate insulator films and, thereafter, the portion of the gate electrodes connected to the dummy gate runner may be electrically separated to be used as the gate electrodes 8. The timing to execute the screening for the gate insulator films can, therefore, be changed variously. The present invention is also valid even when the conduction types are inversed.

As described above, the fabrication method of a semiconductor device, the evaluation method of a semiconductor device, and the semiconductor according to the present invention are useful for a MOS semiconductor device including the dummy trench MOS cells each short-circuited to the emitter electrode.

According to the above invention, in the MOS semiconductor device including the second trench gate structure at a potential other than the gate potential (for example, the emitter potential), the electrode portion and the gate electrode of the second trench gate structure are electrically separated from each other until the screening is executed for the gate insulator film of the second trench structure, whereby a predetermined voltage can be applied between the electrode portion and the gate electrode of the second trench gate structure and the screening can be executed for the gate insulator film of the second trench gate structure during the fabrication process. Consequently, after the dicing of the semiconductor wafer, semiconductor chips having a faulty gate insulator film in the second trench gate structure can be removed. According to the above invention, after the screening executed for the gate insulator film of the second trench gate structure, the electrode portion and the gate electrode of the second trench gate structure are short-circuited to each other in the process steps to produce (fabricate) the semiconductor device (such as, for example, the plating process step and the assembling step) and, a product can, therefore, be completed whose electrode portion and gate electrode of the second trench gate structure are short-circuited to each other at the end of the product process even when the screening is executed for the gate insulator film of the second trench gate structure during the fabrication process.

According to the fabrication method of a semiconductor device, the evaluation method of a semiconductor device, and the semiconductor device of the present invention, an effect is achieved that the market failure rate can be reduced for a trench gate semiconductor device including the dummy trench MOS cell having no channel region formed in the trench side wall.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

This application is based upon and claims the benefit of priority of the prior Japanese Patent Application No. 2014-089124, filed on Apr. 23, 2014, the entire contents of which are incorporated herein by reference.

What is claimed is:

1. A fabrication method of a semiconductor device that includes a plurality of trench gate structures each having a gate electrode extending in a depth direction of an element and a gate insulator film, the plurality of trench gate structures including first trench gate structures respectively contributing to control of the element and second trench gate structures respectively not contributing to the control of the element, the fabrication method of a semiconductor device comprising:
    forming the plurality of trench gate structures on a front face of a semiconductor substrate;
    forming on the front face of the semiconductor substrate, an electrode pad connected to the gate electrode of at least one of the trench gate structures among the plurality of trench gate structures;
    executing screening by applying a predetermined voltage to gate insulator films in contact with each gate electrode connected to the electrode pad by applying the predetermined voltage between an electrode portion having a potential other than a gate potential and the electrode pad; and
    forming the second trench gate structures respectively having the gate electrode connected to the electrode pad, by short-circuiting the electrode portion and the electrode pad to each other after executing screening.

2. The fabrication method of a semiconductor device according to claim 1, wherein
    the forming of the electrode pad includes forming the electrode pad to which each gate electrode of the plurality of trench gate structures is connected by a single wire,
    the fabrication method further comprising after executing screening and before forming the second gate structures, electrically separating gate electrodes from the single wire and connecting the separated gate electrodes to a second electrode pad different from the electrode pad, wherein
    the forming of the second trench gate structures includes forming the second trench gate structures respectively comprising the separated gate electrodes, by short-circuiting to each other the electrode portion and the second electrode pad connected to the separated gate electrodes.

3. The fabrication method of a semiconductor device according to claim 1, wherein
    the forming of the second trench gate structures includes forming a plated film to cover the electrode portion and the electrode pad to which each gate electrode of the second trench gate structures is connected, and
    the electrode portion and the electrode pad to which each gate electrode of the second trench gate structures is connected, being connected through the plated film spreading between the electrode portion and the electrode pad to which each gate electrode of the second trench gate structures is connected.

4. The fabrication method of a semiconductor device according to claim 1, wherein
    the forming of the second trench gate structures includes forming a plated film on a surface of the electrode portion and a surface of the electrode pad to which each gate electrode of the second trench gate structures is connected, and soldering an electrode layer to be an electrode terminal, to the electrode pad to which the electrode portion and each gate electrode of the second trench gate structures are connected through the plated film, and
    the electrode portion and the electrode pad to which each gate electrode of the second trench gate structures is connected are connected by a solder layer spreading between the electrode portion and the electrode pad to each the gate electrode of the second trench gate structures is connected.

5. The fabrication method of a semiconductor device according to claim 1, wherein
    the forming of the second trench gate structures includes executing a wiring process using wire bonding, respectively for the electrode portion and each gate electrode of the first trench gate structures, and connecting by the wire bonding, the electrode portion and the electrode pad to which each gate electrode of the second trench structures is connected.

6. The fabrication method of a semiconductor device according to claim 1, further comprising
    executing after screening and before forming the second gate structures, a wiring process using wire bonding, respectively for the electrode portion and each gate electrode of the first trench gate structures, wherein
    the forming the second gate structures includes connecting the electrode pad to which each gate electrode of the second trench gate structures is connected and the electrode portion disposed in an external circuit.

7. The fabrication method of a semiconductor device according to claim 1, wherein
    the electrode portion is an emitter electrode electrically connected to a portion of the semiconductor substrate, the portion being along trenches of the trench gate structures.

8. A semiconductor device fabricated using the fabrication method of a semiconductor device according to claim 1.

9. An evaluation method of a semiconductor device that includes a plurality of trench gate structures each having a gate electrode extending in a depth direction of an element and a gate insulator film, the plurality of trench gate structures including first trench gate structures respectively contributing to control of the element and second trench gate structures respectively not contributing to the control of the element, the evaluation method comprising:
    executing screening before forming the second trench gate structures respectively having the gate electrode connected to an electrode pad by short-circuiting to an electrode portion having a potential other than a gate potential, the electrode pad to which the gate electrode of at least one trench gate structure is connected among the plurality of trench gate structures formed on a front face of a semiconductor substrate, wherein
    the screening is executed by applying a predetermined voltage to gate insulator films respectively in contact with the gate electrode connected to the electrode pad by applying the predetermined voltage between the electrode portion and the electrode pad.

* * * * *